United States Patent [19]

Fukada et al.

[11] Patent Number: 5,014,100
[45] Date of Patent: May 7, 1991

[54] IMAGE SENSOR FREE FROM UNDESIRABLE INCIDENT LIGHT RAYS WHICH HAVE NOT BEEN REFLECTED IN THE SURFACE BEARING THE IMAGE TO BE SENSED

[75] Inventors: Takeshi Fukada, Ebina; Mitsufumi Codama, Atsugi; Mitsunori Sakama, Hiratsuka; Nobumitsu Amachi, Atsugi; Naoya Sakamoto, Atsugi; Ichiro Takayama, Atsugi, all of Japan

[73] Assignee: Semiconductor Energy Laboratory Co., Ltd., Kanagawa, Japan

[21] Appl. No.: 285,419

[22] Filed: Dec. 16, 1988

[30] Foreign Application Priority Data

Dec. 18, 1987 [JP] Japan .................. 62-321688
Dec. 18, 1987 [JP] Japan .................. 62-321689

[51] Int. Cl.⁵ .................................... H01L 27/14
[52] U.S. Cl. ........................... 357/30; 357/55; 357/68
[58] Field of Search .................. 357/30, 55, 68

[56] References Cited

U.S. PATENT DOCUMENTS 4,518,815  5/1985  Yamazaki ................... 357/30

Primary Examiner—Edward J. Wojciechowicz
Attorney, Agent, or Firm—Sixbey, Friedman, Leedom & Ferguson

[57] ABSTRACT

A contact image sensor for use in facsimile machines is described. A light window is opened through a photosensitive semiconductor film deposited on a glass sustrate. Light rays are passed through the light window, reflected on an original and absorbed by the semiconductor film in order to produce image signals containing visual information of the original. Provided on the light incident side of the semiconductor film is a light blocking electrode which prevents incident light rays from directly entering the semiconductor film therethrough without reflection on the original. The opposing electrode formed on the other side of the semiconductor film is made of a transparent film covering the side surface of the light window. The opposing electrode on the side surface functions to eliminate noise signals caused by undesirable light rays incident through the side surface, which otherwise, would deteriorate the output signals of the image sensor.

2 Claims, 3 Drawing Sheets

IMAGE SENSOR FREE FROM UNDESIRABLE INCIDENT LIGHT RAYS WHICH HAVE NOT BEEN REFLECTED IN THE SURFACE BEARING THE IMAGE TO BE SENSED

BACKGROUND OF THE INVENTION

The present invention relates to an image sensor free from undesirable incident light rays which have not been reflected in the surface bearing the image to be sensed.

Along with the efforst to decrease the sizes of facsimile machines, photo-copying machines and the like, contact image sensors, as a very small photo-electric conversion sensor, have attracted interest of the researchers.

A couple of examples of conventional image sensors are illustrated in FIGS. 1(A) and 1(B). The sensor structure of FIG. 1(A) comprises a glass substrate 1, a front light blocking electrode 2, a photosensitive semiconductor film 3, a rear transparent electrode 4, and a transparent protector layer 5 which is to make direct contact with an original 6. A light window 7 is opened in the photoelectric conversion structure consisting of the electrodes 2 and 3 and the semiconductor film 5. Light rays 8 passed through the light window 7 are reflected by the original 6 and absorbed by the semiconductor film 3 with the visual information contained in the original 6.

Since the photoelectric conversion structure is formed by scribing the triple-layered laminae consisting of the electrodes 2 and 4 and the semiconductor film 3, there is a chance of forming short current paths across the opposed electrodes 2 and 4 during the simultaneous scribing. The sensor illustrated in FIG. 1(B) is constructed as similar to the structure of FIG. 1(A) except that a metallic electrode 9 is deposited on the semiconductor film 3 after scribing the underlying semiconductor film 3 and the light blocking electrode 2. The formation of short current paths between the electrodes 9 and 2 is unlikely in this case. This case, however, requires a fine patterning technique capable of fabricating comb electrode structures with adjacent conductive lines separated by several microns intervals.

Furthermore, in either case, it is evitable to suffer from the noise originating from the light rays which are inadvertently obliquely incident to the semiconductor film from its side surface 13. These undesirable light rays can produce carriers independent of whether the original 6 is white or black, and therefore reduce the quality of the copy.

SUMMARY OF THE INVENTION

It is an object of the present invention to provide an image sensor capable of operating without sensing error.

It is an object of the present invention to provide an image sensor which can be produced at a low production cost due to high yield.

DETAILED DESCRIPTION OF THE PREFERRED EMBODIMENTS

Figure 1A:
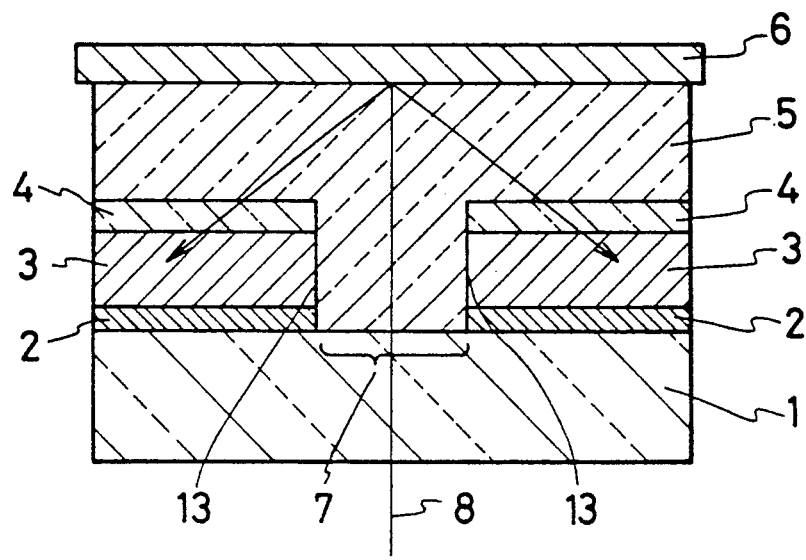
FIGS. 1(A) and 1(B) are cross sectional views showing prior art image sensors.
Figure 1B:
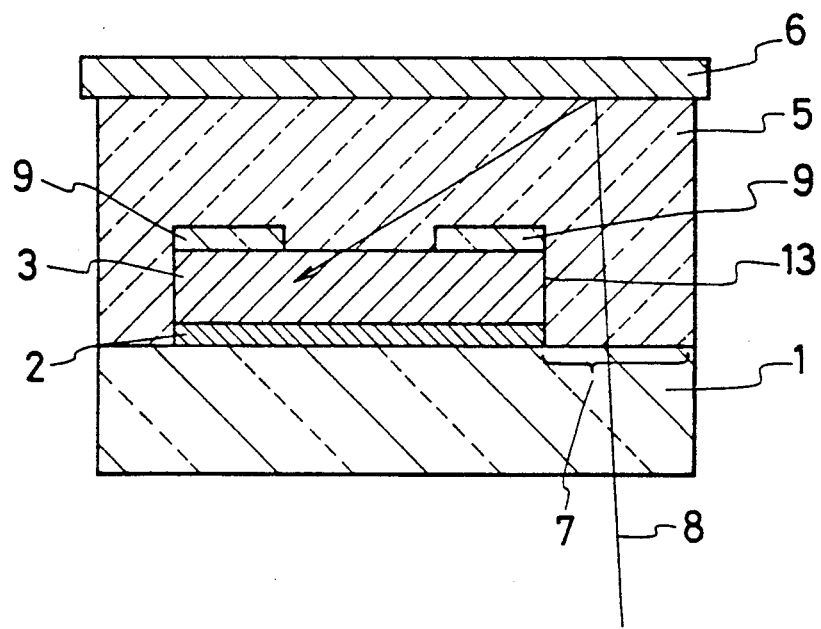
Figure 2:
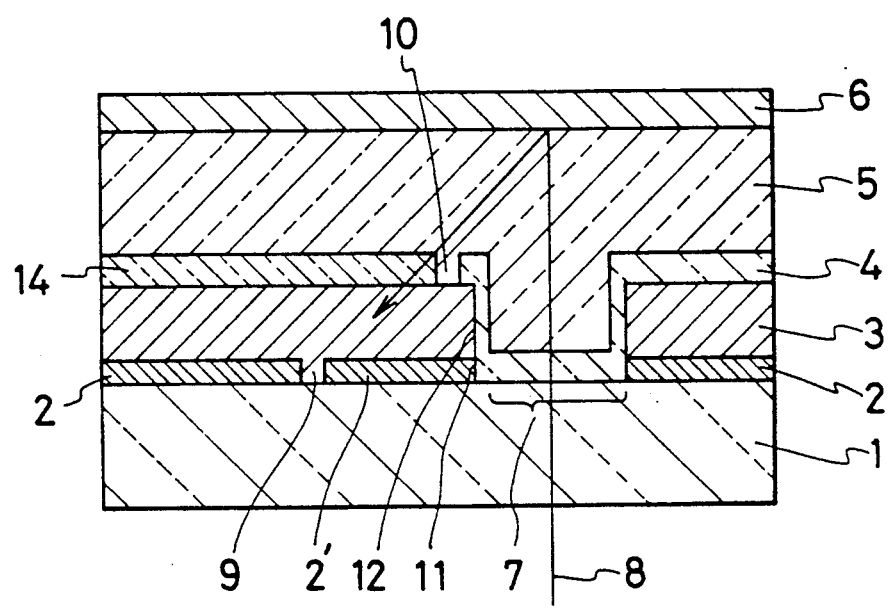
FIG. 2 is a cross sectional view showing the structure of an image sensor in accordance with the present invention.

Referring now to FIG. 2, a gap-less type image sensor in accordance with the present invention is illustrated. The sensor comprises a glass substrate 1, a light blocking electrode 2 made of an opaque conductive material, a photosensitive amorphous silicon semiconductor film 3, a transparent electrode 4 and a protective layer 5. A light window 7 is opened in the semiconductor film 3 and the light blocking electrode 2. The transparent electrode 4 is formed also in the light window 7 and the side surface 12 of the semiconductor film 3 and electrically separated by a groove 10 at the position just adjacent to the light window 7. The underlying light blocking electrode 2 is also separated by a groove 9 at the point a certain length distant from the light window 7. The diagram is drafted only for illustrative purpose, and in which only one complete sensor segment is shown. In reality, a plurality of sensing elements as illustrated in the figure are formed in an array, for example, a row in order to provide a line sensor. Namely, deposition and patterning of an opaque conductive film, an semiconductor film and a transparent film are performed in order that a plurality of photosensitive elements are constructed in an array, each element being composed of the light blocking electrode 2, the semiconductor film 3 and the transparent electrode 4 as illustrated in the figure. Output signals from each element can be obtained respectively between the light blocking and transparent electrodes.

The sensor can be fabricated in the following manner. A cromium film is deposited to a thickness of 500 angstroms by a known sputtering technique and subjected to laser scribing a KrF eximer laser (248 nm) in order to form the light blocking electrode 2 which is electrically separated by the groove 9 into the right and left portions in the figure. The photosensitive amorphous silicon semiconductor film 3 on the electrode 2 is formed by sequentially depositing a 300 Å thick n-type amorpous silicon film, a 6000 Å thick intrinsic amorpous silicon film, and a 300 Å thick p-type amorpous silicon film in this order by a known plasma CVD. The window 7 is opened through the electrode 2 and the semiconductor film 3 by means of the eximer laser. A 1000 Å thick ITO film is deposited on the semiconductor film 3 and the opening 7 covering the side surfaces thereof by sputtering. The groove 10 which electrically separates the right and left portions of the ITO (indium tin oxide) film is formed by eximer laser scribing in the same way for forming the groove 9. Finally, a 10 microns thick polyimide film as the protective layer is formed over the structure by a known spinner.

By this structure, the photosensitive region is located between the grooves 9 and 10 and constructed immune to undesirable light rays, due to the side covering transparent electrode, which directly enter the semiconductor film without reflecting on the original 6. If some light rays are incident to the edge portion of the film 3, carriers generated by the incident rays quickly disappear in the light of the electrode 4 which makes contact with the side surface 12 of the film 3 and therefore induce little noise in the output signals.

Figure 3:
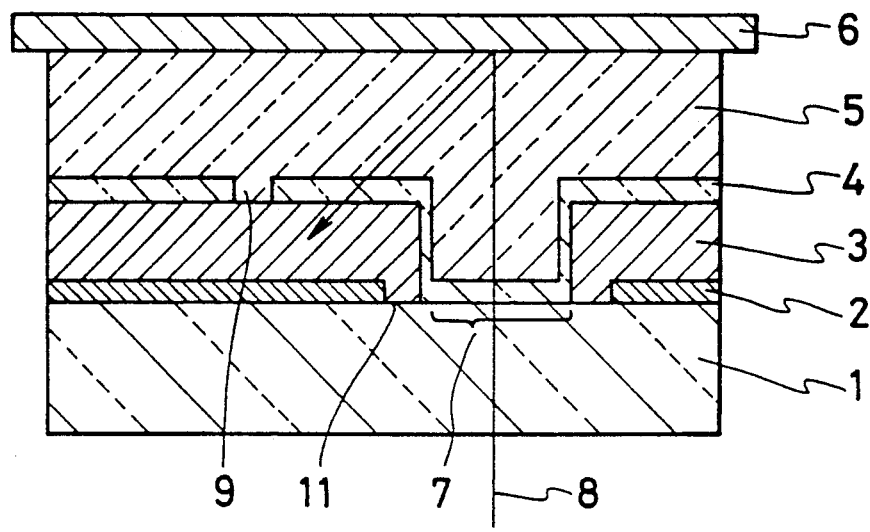
FIG. 3 is a cross sectional view showing a modification of the embodiment illustrated in FIG. 2.

FIG. 3 is a cross sectional view showing a modification of the above mentioned embodiment. In this embodiment, a 120 microns wide groove is formed in the light blocking electrode 2 in advance of depositing the semiconductor film 3. A 100 microns wide light window 7 is opened in the semiconductor film 3. As seen from the figure, the transparent electrode 4 and the light blocking electrode 2 are electrically separated by the semiconductor portion intervening between the light window 7 and the electrode 2. A groove 9 is formed a certain length distant from the window 7 so that a photosensitive region is located between the groove 9 and the window 7. In this structure, output signals are obtained between the electrodes 2 and 4.

Figure 4:
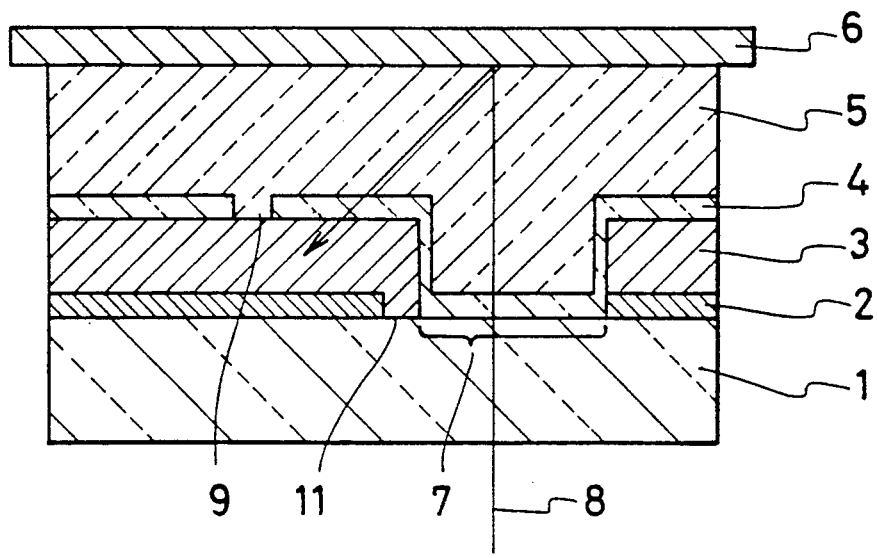
FIG. 4 is a cross sectional view showing a modification of the structure shown in FIG. 3.

FIG. 4 is a cross sectional view showing a modification of the structure shown in FIG. 3. In this structure, the right portion of the light blocking electrode 2 is formed in electrical contact with the transparent electrode 4 throught light window 7. Output signals can be obtained between the portions of the electrode 2.

While several embodiments have been specifically described, it is to be appreciated that the present invention is not limeted to the particular examples described and that modifications and variations can be made without departure from the scope of the invention as defined by the appended claims. For example, although the examples are constructed with the light blocking electrodes made of cromium. composite electrodes may be used, such as a laminate film consisting of an ITO film and a Mo film. In case of this case where the constituent ITO film makes contact with the transparent electrode (made also of an ITO film), the reliability of electrical connection between the light blocking film and the transparent film is increased.

We claim:

1. An image sensor comprising:
   a transparent substrate;
   a light blocking electrode formed on said transparent substrate, said electrode having a first groove by which said electrode is isolated into two parts;
   a photosensitive semiconductor layer formed on said substrate;
   a light window formed in said light blocking electrode and said photosensitive semiconductor layer;
   a transparent electrode formed on said photosensitive semiconductor layer, the inside surface of said light window and the substrate in said light window, wherein said light blocking electrode and said transparent electrode contact each other at said light window; and
   a second groove formed on said transparent electrode for isolating said transparent electrode into two portions, said second groove being positioned near the light window so that a sensing region is defined in said semiconductor layer between said first and second grooves.

2. An image sensor comprising:
   a transparent substrate;
   a light blocking electrode formed on said transparent substrate;
   an opening formed in said light blocking electrode through which can pass;
   a photosensitive semiconductor layer formed on said light block electrode, a portion of said semiconductor layer extending beyond at least a portion of said light blocking electrode so that a portion of said opening is covered with the semiconductor layer thereby defining a light window;
   a tranparent electrode formed on said photosensitive semiconductor layer, the inside surface of said light window and the substrate in said light window; and
   a groove formed on said transparent electrode for dividing said transparent electrode into two portions, wherein a sensing region is defined in the semiconductor layer between said groove and said light window excluding that portion of said semiconductor layer extending beyond said light blocking electrode.

* * * * *